United States Patent
Dean et al.

(10) Patent No.: US 6,237,132 B1
(45) Date of Patent: May 22, 2001

(54) TOGGLE BASED APPLICATION SPECIFIC CORE METHODOLOGY

(75) Inventors: Alvar A. Dean; Kenneth J. Goodnow, both of Essex Junction; Scott W. Gould, South Burlington; Kenneth Torino, Colchester; Sebastian T. Ventrone, South Burlington, all of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/136,126

(22) Filed: Aug. 18, 1998

(51) Int. Cl.⁷ .................................................. G06F 17/50
(52) U.S. Cl. ..................................... 716/18; 716/2; 716/3; 716/4; 703/15
(58) Field of Search ...................... 716/1–21; 703/14–16

(56) References Cited

U.S. PATENT DOCUMENTS

| | | | |
|---|---|---|---|
| 4,602,339 | 7/1986 | Aihara et al. | 716/19 |
| 4,816,999 | 3/1989 | Berman et al. | 716/2 |
| 4,960,724 | 10/1990 | Watanbe et al. | 716/2 |
| 5,347,465 | 9/1994 | Ferreri et al. | 716/19 |
| 5,502,645 | * 3/1996 | Guerra et al. | 716/18 |
| 5,515,526 | 5/1996 | Okuno | 716/2 |
| 5,535,370 | 7/1996 | Raman et al. | 703/15 |
| 5,991,523 | * 11/1999 | Williams et al. | 716/18 |

OTHER PUBLICATIONS

Cheng et al. ("Multi–Level Logic Optimization By Redundancy Addition and Removal", Jan. 1993, pp. 373–377).*
Wu et al. ("Multiple Redundancy Removal During Test Generation and Synthesis", IEEE VLSI Test Symposium 1992, Jan. 1992, pp. 274–279).*
Kapoor et al ("Area, Performance, and Sensitizable Paths", IEEE Proceedings of Fourth Great Lakes Symposium on Design Automation of High Performance VLSI Systems, GLSV '94, Jan. 1994, pp. 222–227).*

* cited by examiner

*Primary Examiner*—Matthew Smith
*Assistant Examiner*—Phallaka Kik
(74) *Attorney, Agent, or Firm*—Schmeiser, Olsen & Watts; Eugene I. Shkurko

(57) ABSTRACT

According to the present invention, an automated method to tailor an ASIC core to meet the needs of an individual system on a chip design is disclosed. The preferred method starts with a technology-independent hardware description language (HDL) representation of the core des i on. This high-level design is subdivided into functions, or blocks. Blocks which cannot be removed without impacting the integrity of the core design an are ta b y ed with "must-keep" indicators. The execution of all application code that will employ the core is simulated on the high-level model. The simulation process accumulates information about what blocks in the model are used by the application code, and which are unused, information about which blocks are unused is combined with information about what blocks are not removable. The high-level core design is then tailored by deleting blocks in the core design that are both unused and removable. The tailored high-level design is then synthesized to a technology-dependent core design. The synthesis process substitutes gates for the blocks, propagating must-keep tags to all gates substituted for a block tagged with a "must-keep" indicator. The simulation of all application code is repeated on the low-level design, and accumulates information about which gates are unused by the application code. The low-level design is then tailored by deleting Yates in the core that are both unused and removable.

19 Claims, 5 Drawing Sheets

TOGGLE BASED APPLICATION SPECIFIC CORE METHODOLOGY

BACKGROUND OF THE INVENTION

1. Technical Field

This invention generally relates to integrated circuits, and more specifically relates to the area of microprocessor cores which are embedded on application-specific integrated circuits (ASICs).

2. Background Art

The proliferation of modern electronics is due in large part to the development of the integrated circuit. An application specific integrated circuit (ASIC) is a collection of logic and memory circuits designed to perform a specific task to meet the needs of a customer application. ASIC designs are implemented on a silicon die by mapping logic functions to a set of pre-designed, pre-verified logic circuits. These circuits range from the simplest functions to highly complex circuits referred to as "cores." Cores are typically high level industry-standard functions, such as a digital signal processor (DSP), an advanced RISC machines (ARM) microprocessor, an Ethernet function, or a peripheral component interconnect (PCI) controller. With a particular design in mind, customers can quickly assemble an ASIC design by using cores as building blocks. Such designs are commonly referred to as system level integration (SLI) or system on a chip (SOC).

In some ASIC designs, application code is embedded in read only memory (ROM) on the silicon die along with the circuitry that supports the execution of the application code. Typically, application code embedded in a system on a chip is the only application code that will ever use the circuitry on the ASIC, and since it is embedded, the code will never change. This type of ASIC design differs from a more traditional ASIC design where application code employing the chip is not embedded. When not embedded in the chip, the application code can be changed independently from the ASIC circuitry.

Traditional ASICs are designed to operate as generally as designers conceive necessary for the range of applications they will support. As a result, they include circuitry designed to support a wide range of applications. Thus, some circuitry designed into the ASIC might not be employed by any of the applications that employ the chip. Yet that unused circuitry is necessary from the design standpoint, to support unforseen application code changes. Therefore, in order to maximize the usefulness of an ASIC that will run non-embedded application code, unused circuitry is not removed and serves to assure that the ASIC will still operate in the case of changed, or new application code. For example, in the case of cores, all the general purpose core circuitry may not be employed by the independent applications using the ASIC. However, to maintain the usefulness of the industry standard grouping of circuitry making up the core, unused core circuitry is not removed from the design.

On the other hand, there is no reason to maintain unused circuitry in general purpose cores for ASIC designs in which all the application code that will ever use the circuitry is embedded on the chip. For such designs, a different approach can be used to maximize the amount of circuitry that can be placed on one silicon die. If circuitry in a general purpose core is not being used by any of the applications to be embedded on the chip, then the unused circuitry can be removed. The result is a "tailored" core, which has only the circuitry required to support the application code embedded on the ASIC. Advantages to tailoring cores, that is, advantages to removing unused circuitry, include lower power consumption and faster execution of the embedded applications, as well as smaller silicon area requirements. Thus, for systems on a chip, there is a need to tailor core circuitry, that is, to identify during ASIC design what circuitry will not be utilized by embedded applications and to remove it.

An example of unused core circuitry occurs in designing systems on a chip for use in cellular phones. Cellular phone applications require the use of digital signal processor (DSP) cores to enhance and filter sounds. While the global systems for mobile telecommunications (GSM) application heavily uses certain circuitry in the DSP core, other parts of that core are not required at all. Tailoring the core circuitry for this application would remove the unused parts of the DSP. For battery operated cellular phones, the advantages of lower power consumption and reduced silicon area that result from removing the unused core circuitry are critical. Thus, there is a need to tailor the general purpose DSP core in a system in a chip to be used in cellular phones.

A problem associated with the concept of tailoring cores is the labor required. To provide the advantages of reduced core circuitry in every system in a chip design, each general purpose core on the design would have to be tailored to the each of the applications embedded on the ASIC. Given that each ASIC design typically utilizes more than one core, and given the proliferation of ASIC use in the electronics industry today, the labor required to tailor ASIC cores can be significant. Thus, to tailor highly complex core circuitry to each ASIC design, an automated method of circuit reduction is certainly advantageous over non-automated methods.

A second problem associated with tailoring general purpose core circuitry is the need to preserve as much integrity of the original core design as possible. Since cores are pre-designed, pre-verified functional groupings of circuitry, all of the circuitry is there for a purpose. The process of tailoring cores needs to identify and remove circuitry whose purpose does not serve a specific set of applications. Sometimes circuitry in a general core design is unused during normal operation, but serves a purpose in the manufacture testing process, or to perform error recovery operations. Removal of that type of unused circuitry may corrupt the integrity of the original design. Thus, there is a need in tailoring cores to identify core circuitry which may not serve a specific set of application code directly, but which cannot be removed without corrupting the integrity of the core design.

In some ways, the concept of tailoring cores resembles other logic reduction tools that are used in circuitry design today. However, those tools do not address the specific needs associated with tailoring cores for use on systems in a chip. For example U.S. Pat. No. 4,960,724 "Method For Deleting Unused Gates And Method For Manufacturing Master-Slice Semiconductor Integrated Circuit Device Using The Deleting Method" (issued Oct. 2, 1990 to Watanabe et al. and assigned to Hitachi, Ltd.) discloses a method of tracing signal paths through a total circuit diagram, and deleting unconnected gates. However, Watanabe el al.'s method does not have any way of recognizing what circuitry should not be removed, even if unused. Nor is Watanabe et al.'s method automated.

Another group of patents address logic reduction by examining circuit utilization and deleting unused circuitry. U.S. Pat. No. 5,347,465 "Method Of Integrated Circuit Chips Design" (issued Sep. 13, 1994 to Ferreri et al. and assigned to IBM Corp.) and U.S. Pat. No. 4,602,339

"Method Of Manufacturing Master-Slice Integrated Circuit Device" (issued Jul. 22, 1986 to Aihara et. al. and assigned to Fujitsu Ltd.) both disclose methods to delete unconnected circuitry. However, neither of these methods take into account what application code will utilize the circuitry, which is critical for accurately tailoring cores.

Still others have reduced circuitry by checking for redundant connections. U.S. Pat. No. 4,816,999 "Method Of Detecting Constants And Removing Redundant Connections In A Logic Network" (issued Mar. 28, 1989 to Berman et al. and assigned to IBM Corp.) and U.S. Pat. No. 5,515,526 "Apparatus For Detecting Redundant Circuit Included In Logic Circuit And Method Therefor" (issued on Jun. 7, 1996 to Okuno and assigned to Mitsubishi) both disclose methods to eliminate redundant circuitry. With general purpose core designs, it is likely that redundant circuitry has already been removed, since cores are pre-designed and pre-verified. Thus, this group of patents does not specifically address the needs of tailoring ASIC cores.

To efficiently tailor core logic to serve the needs of each individual system on a chip, an automated means is required to reduce the labor requirements. To accurately tailor core logic, a method is needed which takes into account what application code will be the only code that used the core circuitry, that is, the application code to be embedded on the ASIC. Further, a method to accurately tailor core logic requires that core integrity be preserved for functions that might not be used in the normal application code execution, but which are needed for auxiliary purposes such as testing and error recovery. None of the prior methods address these needs.

Given the growing use of system level integration or system on a chip ASIC designs, there is a need to be able to tailor core circuitry for use with embedded application code. Tailoring core circuitry for an individual design reduces power requirements, speeds up execution, and maximizes the number of applications that can be embedded on one silicon die. Tailored core circuitry will provide especially useful to battery-operated, hand-held electronic devices, which have power supply, size and weight limitations. As the use of such electronic devices grows, the need for an accurate and efficient method of tailoring cores to specific system on a chip designs will become more important.

DISCLOSURE OF INVENTION

According to the present invention, an automated method to tailor an ASIC core to meet the needs of an individual system on a chip design is disclosed. The preferred method starts with a technology-independent hardware description language (HDL) representation of the core design. This high-level design is subdivided into functions, or blocks. Blocks which cannot be removed without impacting the integrity of the core design are tagged with "must-keep" indicators.

The execution of all application code that will employ the core is simulated on the high-level model. The simulation process accumulates information about what blocks in the model are used by the application code, and which are unused. Information about which blocks are unused is combined with information about what blocks are not removable. The high-level core design is then tailored by deleting blocks in the core design that are both unused and removable.

The tailored high-level design is then synthesized to a technology-dependent core design. The synthesis process substitutes gates for the blocks, propagating must-keep tags to all gates substituted for a block tagged with a "must-keep" indicator. The simulation of all application code is repeated on the low-level design, and accumulates information about which gates are unused by the application code. The low-level design is then tailored by deleting gates in the core that are both unused and removable.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

Figure 1:
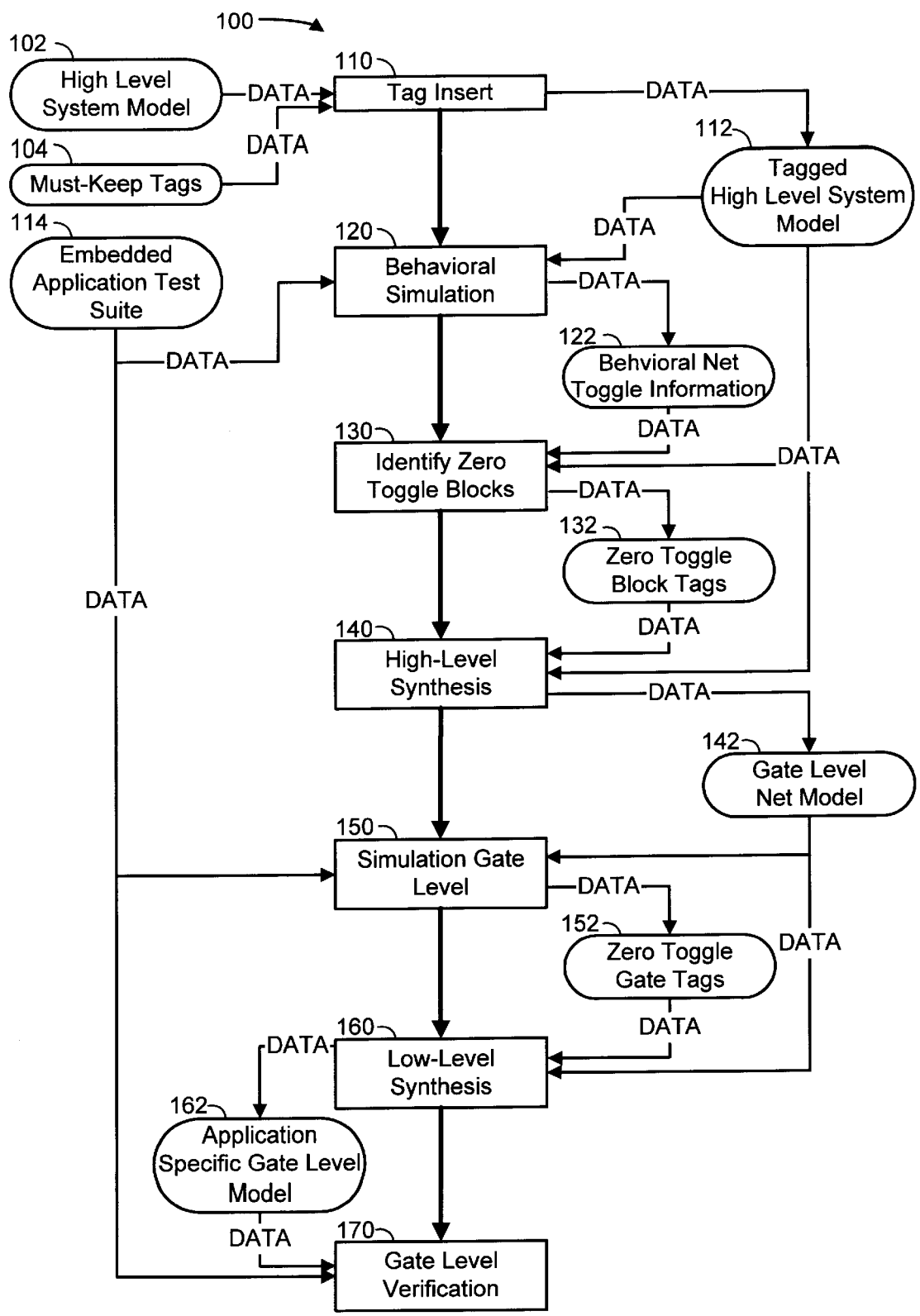
FIG. 1 is a flowchart of a preferred embodiment of an automated method to tailor core logic for system in a chip ASIC design.

The present invention relates to application specific integrated circuit (ASIC) core development for embedded applications. For those individuals who are not generally familiar with ASIC design, the Overview sections below presents many of the basic concepts and terminology that will help to understand the invention. Individuals skilled in the art of ASIC design may skip the Overview and proceed directly to the Detailed Description of this specification.

Overview

The proliferation of modern electronics is due in large part to the development of the integrated circuit. An application specific integrated circuit (ASIC) is a collection of logic and memory circuits designed to meet the needs of a specific application. Designs are typically implemented in a single silicon die by mapping logic functions to a set of pre-designed, pre-verified logic circuits, ranging from the simplest functions to highly complex circuits referred to as "cores." Core designs typically include many high level industry standard functions, such as a digital signal processor (DSP), an advanced RISC machines (ARM) microprocessor, an Ethernet function, or a peripheral component interconnect (PCI) controller.

In some ASIC designs, called "system on a chip" designs, application code is embedded in read only memory (ROM) along with the circuitry on a silicon die. The embedded application code is typically the only application code that will ever use the circuitry on such an ASIC. An example of a system on a chip design is for an ASIC installed into a cellular phone. Cellular phones are designed such that all the computerized applications are embedded on the ASICs along with the circuitry necessary to support them. For instance, cellular phone applications typically require a digital signal processor (DSP) core to filter and enhance sound. A DSP core specializes in analyzing and transforming wave forms, and thus can be used to enhance, filter, or modulate images, sounds, and radar pulses. Thus a system on a chip design for a cellular phone will typically contain a DSP core as part of its circuitry.

The design of ASIC devices uses four basic steps: (1) design entry, (2) design analysis through logic simulation (3) logic synthesis and (4) design verification. In the design entry phase, the application functions for the ASICs are described in a Hardware Description Language (HDL). The two dominant HDL's are Verilog and VHDL. Both are languages, much like programming languages, which have been designed specifically for describing hardware behavior. HDL's allow designers to describe the operation of their ASIC designs at a high level, often independent of the eventual implementation in silicon, much as a programmer can describe the operation of a program without knowing the specific compiler that will create the executable object code.

Typical general purpose cores are pre-designed, pre-synthesized, and pre-verified gate functions. Gates are combinations of transistors which form a circuit that performs a logic function. The core designs can be expressed in HDL, in which case they are referred to as "soft cores." Soft cores can be described using HDL as either high level or low level netlists. A netlist is a file of elements and their interconnections. High level netlists are technology independent and are made up of blocks, which include functionally grouped sections of circuitry. For example, in a microprocessor cores, one block might be the memory unit, another block might be the execution unit, and another block might be a decoder unit. Low level netlists are technology-dependent and are made up of gates.

After entering a design in an HDL, the designer begins the process of design analysis to determine if the HDL model correctly implements the intended operation. The traditional method is through logic simulation, which evaluates how a design behaves. Standard logic simulator tools include Verilog X-L, Leapfrog from Cadence, VSS from Synopsys, and MTI from Model Technology, Inc. During the simulation process, the HDL is read into a simulator tool along with a set of "input vectors" created by the designer. The simulator tool generates "output vectors" that are captured and evaluated against a set of expected values. If the output values match the expected values, then the simulation passes, and the design is considered correct. If the output values differ, then the simulation is said to fail and the design needs to be corrected.

Following logic simulation, logic synthesis transforms the HDL representation into technology-specific logic circuits. In this phase of the design, timing, power, and silicon area constraints are specified to the synthesis tool. The output of the synthesis process is a netlist of circuit instances interconnected in a manner that implements the logical operation of the design. The netlist can be written in several formats or languages, including VHDL, Verilog, and Electronic Design Interchange Format (EDIF). The interconnected circuits may also be graphically represented as schematics. Many standard synthesis tools are available, such as Design Compiler by Synopsys, and BooleDozer by IBM.

After synthesizing the HDL into a netlist, the design is verified to ensure it is operationally correct and meets the physical constraints in terms of performance, testability, power, silicon area, and technology-specific electrical checks. Although the design was operationally verified before synthesis using simulation, after synthesis, the design is re-simulated to ensure that its operation has not been corrupted by the synthesis process.

Detailed Description

The present invention is an automated method to tailor core logic to meet the needs of an individual system on a chip design. What starts out as a general purpose high-level core design becomes transformed into a customized low-level core design that accommodates the specific needs of applications designed to be embedded along with the core on the ASIC. By identifying parts of the core design which may or may not be removed by the tailoring process, the methods of the present invention ensure the integrity of the pre-verified and pre-tested core functioning. By simulating the execution of all the embedded applications that will employ the core on the ASIC, the methods of the present invention identify which parts of the core design are unused. By combining information about which parts of the core are unused and removable, the general core design is customized to accommodate the needs of a specific system on a chip design. ASICs designed using this method have the advantages of lower power requirements, increased speed, and reduced silicon area over ASICs designed without tailored cores.

Referring now to FIG. 1, a flowchart of a preferred method 100 to tailor core circuitry is depicted. High level system model 102 is a high-level representation of the un-tailored, general purpose core design, in technology-independent hardware description language (HDL), such as Verilog or VHDL. The high-level core design is subdivided into blocks, or functions, which are groupings of HDL that operate like units or subroutines. For instance, in a microprocessor core, one block might be the memory unit, another block might be the execution unit, and a third block might be a logic decoder block. Some of the blocks have a specific function which may not be needed by the application code that will employ the core. For example, in a digital signal processor core, a customer might not need all of the serial or parallel port blocks. Alternatively, a customer might only need a fixed point arithmetic block and could remove the floating point arithmetic block.

According to the preferred methods of the present invention, tag insert process 110 adds tags to high-level system model 102 to create tagged high level system model 112. Blocks are tagged "must-keep" if they are not removable, that is, if they are essential to the core design. Tags are identifiers attached to a block, which are queried by later steps in method 100 to prevent any non-removable parts of the core design from being deleted Some blocks may not be removable, in the sense that they may be required for manufacturing testing, or for error recovery purposes. Other blocks may be removable from the core design without impacting core integrity. However, not all blocks that can be removed will be removed by subsequent steps in method 100. Blocks are removed only if they are both removable and unused by any of the application code that will employ the core design.

Examples of tagged blocks, which may not be removed, even if they are unused by the application code, are blocks that support manufacturing tests. For instance, a built in self test (BIST) block would be tagged non-removable, because it is used for testing random access memory (RAM), or read only memory (ROM) arrays during a manufacturing test. Another example is ajoint action test group (JTAG) port block, which is tagged non-removable, because it is employed only for diagnostic purposes, or for card assembly test purposes. Thus, even though the blocks in these examples are never used during normal operation of the application code, they must be kept to maintain the integrity of the core design.

Tag insert process 110 is depicted as the first step in method 100. However, once tag insert process 110 is completed for a particular high level system model 102, and a corresponding tagged high level system model 112 has been created, then tag insert process 110 does not need to be repeated each time the same general purpose core design is tailored for a different ASIC. Instead, tag insert process 110 needs be executed only whenever high level system model 102, or must keep tags 104 change. In other words, tag insert process 110 needs only be executed when there is a change in the high-level HDL representation of the general purpose core design, or whenever a change is made to in the identification of what blocks in the high-level design should be tagged "must-keep." Otherwise, once tagged high level system model 112 is created, it can be reused each time that the core represented by high level system model 112 needs to be tailored.

Once must-keep tags have been inserted into the core design, step 120 behaviorally simulates the execution of application code on tagged high-level system model 112. Step 120 uses embedded application test suite 114 as input. Embedded application test suite 114 is comprised of all the applications that will be embedded on the ASIC, as well as sample input data, or test vectors, to test out the application code. All of the applications which will be embedded upon the ASIC with the core, and which will be the sole users of the core, must be simulated in step 120. In this manner, the methods of the present invention can fully determine which functions in the core design are unused on this particular ASIC design.

Step 120 uses a simulation tool to run behavioral simulation of embedded application test suite 114. Simulation at the behavioral level provides information about how the core model will behave. That is, given test input vectors, simulation of the application code produces output vectors. Behavioral simulation by a standard simulation tool can utilize zero delay, unit delay, or nominal delay operation. In zero delay, all blocks have a delay of zero between an input signal and the output transition. In unit delay, all blocks have a delay of 1, and in a nominal delay simulation, each block has a real number for delay corresponding to technology specific propagation delay into the circuit.

The behavioral simulation process collects net toggle count histories either at the block or sub-block (e.g. register transfer) level. Within the high-level design, blocks and sub-blocks are connected together by "nets." Nets which join blocks together are called input and output nets. Nets which join sub-blocks together within a block are called internal nets. Behavioral simulation traces the use of all types of nets in tagged high level system model 112 during execution of each application. The history information accumulated from running all of the applications in embedded application test suite 114 is written to behavioral net toggle information file 122. In this manner, the methods of the present invention collect comprehensive information about what blocks are used by the applications to be embedded on the ASIC along with the core.

Figure 2:
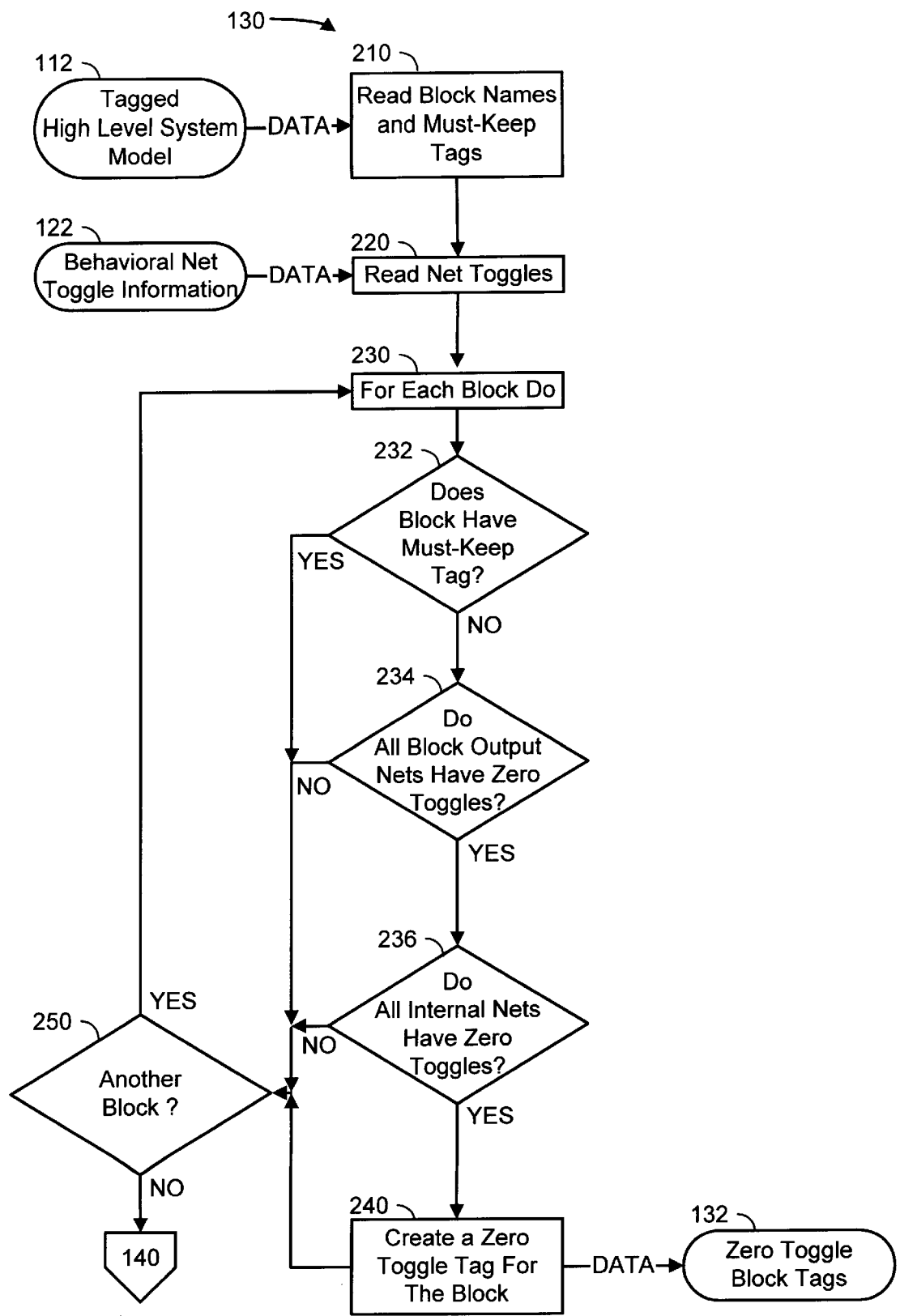
FIG. 2 is a flowchart of a zero toggle block identification process.

Once all of the applications programs have been simulated, step 130 identifies zero toggle blocks. This process combines the information about what blocks are not removable, with the information about what blocks are needed to support the embedded applications. Referring now to FIG. 2, a flowchart of a preferred method to identify zero toggle blocks 130 is depicted. FIG. 2 further details step 130 in method 100.

Step 210 reads block names and must-keep tags from tagged high level system model 112. This information indicates what blocks cannot be deleted from the high-level core design, regardless of whether they are used by the applications. Step 220 reads behavioral net toggle information 122 collected from the simulation process. These two sources of information are used by steps 230 through 250 to create zero toggle block tags 122 for blocks which are both removable and unused during simulation. Zero toggle tags are indicators which signal to subsequent steps in method 100 which blocks can be deleted from high-level system model 112.

If a block queried in step 232 has an associated must-keep tag, then a zero toggle tag is not created for that block. In this way, the methods of the present invention guard against deleting unused blocks that are required to maintain the integrity of the core design. Thus, the core can be customized to a specific system on a chip design, yet maintain the integrity of a pre-verified, pre-tested design.

On the other hand, if the block queried in step 232 does not have an associated must-keep tag, then step 234 examines behavioral net toggle information 122. In particular, step 232 examines whether the block's output nets were toggled during behavioral simulation. Output nets are basically the connections between blocks in a core, that is, connections emanating from one block which derive from another block's input nets. If any of the output nets were toggled by the behavioral simulation, then no zero toggle tag is created for the block, because this block is necessary to support the application code.

On the other hand, if step 234 determines that none of the output nets were toggled for this block, step 236 examines behavioral net toggle information 122. Step 234 is particularly interested in whether the block's internal nets were toggled during behavioral simulation. Internal nets are basically the connections between sub-blocks in the high-level design. Since blocks are groupings of HDL that operate like units, or subroutines, a block will be marked as used if any of its internal nets for this block were toggled during the simulation process. Although in some instances, blocks which have internal nets toggled, yet which do not have any output nets toggled may be redundant blocks, there are other situations where this combination is desirable to the resulting core design. For instance, internal nets may be toggling to catch information that could be used for error diagnostics. Thus, if any portion of the block is toggled, as indicated by the information about internal nets, the entire block is considered used by the application.

On the other hand, if step 236 determines that the block has zero toggles in all of its internal nets, then step 240 creates a zero toggle tag for the block, and writes the information to zero toggle block tags file 132. In this manner, the methods of the present invention identify entire blocks of logic within the high-level core design which can be removed without impacting the integrity of the core design, and which are not needed by the application code that will employ the core. Method 120 is complete when all blocks in tagged high level system model 112 have been processed by steps 230 through 250.

Referring back to FIG. 1, once method 130 identifies which blocks of logic can be deleted from the high-level core design, method 140 employs the use of a synthesis tool to delete zero toggle blocks, and to synthesize the high-level core design to a technology-dependent low-level core design, also called a gate-level design. Examples of synthesis tools that might be used in process 140 are Design Compiler by Synopsys, or BooleDozer by IBM. The standard high-level synthesis is the process of breaking the blocks into parts that can be replaced by instances of circuits. The synthesis process interconnects the instantiated circuits in a manner that duplicates the functionality of the blocks in the high-level design.

Figure 3:
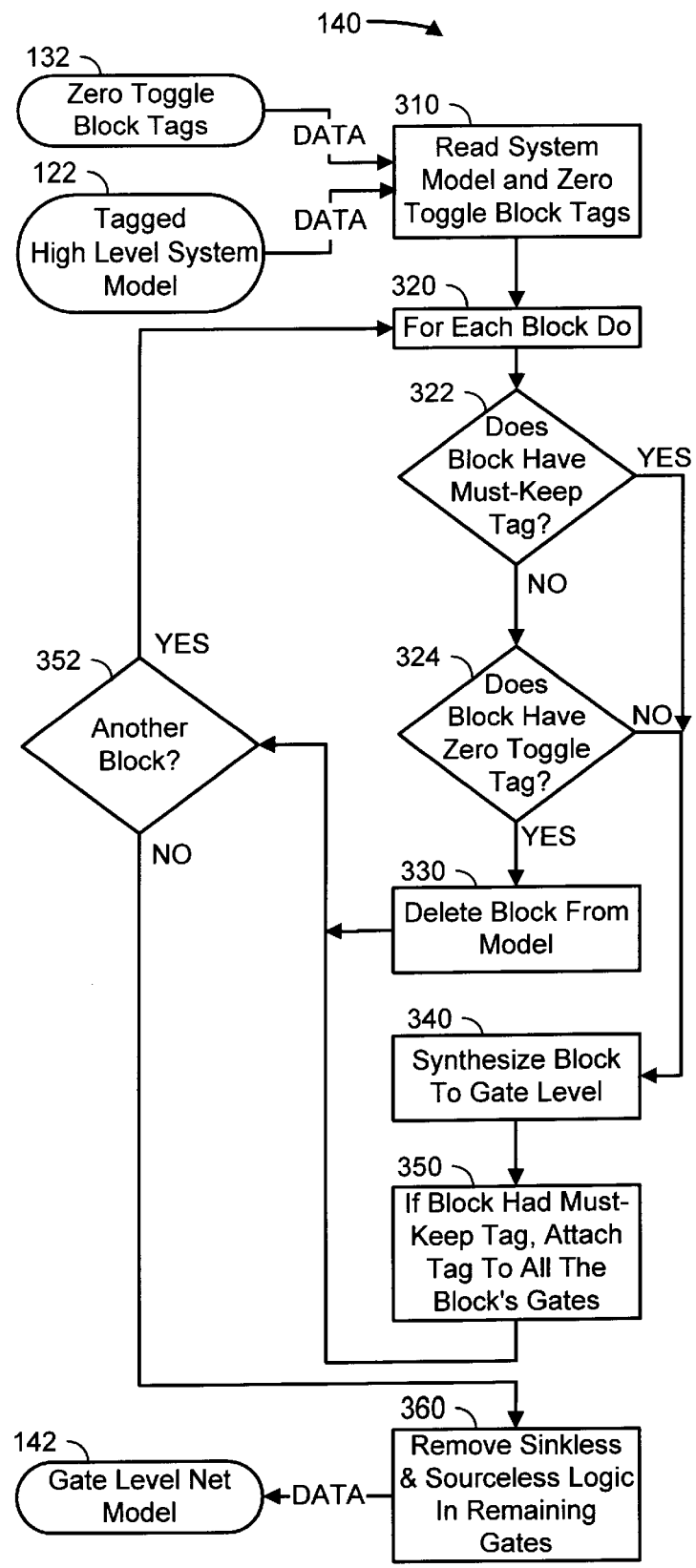
FIG. 3 is a flowchart of a high-level synthesis process.

Referring now to FIG. 3, a flowchart of a preferred method to synthesize the high-level core design to a low-level core design is depicted. FIG. 3 further details step 140 in method 100. Tagged high level system model 112 and zero toggle block tags 132 are read in step 310, so that each block can be individually processed in steps 320 through 350. Although reading a high-level system model is a standard synthesis step, the methods of the present invention employ extension language to step 310 to read zero toggle block tags 132. Extension language allows synthesis tool operations to be enhanced with user written routines.

In the methods of the present invention, extension language is employed to delete blocks of logic from the high-level core design. Only blocks that are both removable and unused by the applications are deleted from the high-level core design. In this manner, the high-level design becomes customized to meet the specific needs of the application code embedded on the ASIC with the core. In more detail, blocks are deleted as follows. Step 322 examines whether the block has a must-keep tag. If not, then the block is removable, and step 324 examines whether the block has a zero toggle tag. If so, the block is both removable and unused, and step 330 deletes the block from the high-level design.

On the other hand, if the block is either non-removable or used by the application code, then the block is "synthesized" to the gate level in step 340. That is, the block is broken into parts that can be replaced by instances of circuits. The instantiated circuits are interconnected in a manner that duplicates the functionality of the block in the high-level design. Step 322 makes the determination that a block is not removable. Alternatively, in the case where step 322 determines that a block is removable, step 324 makes the determination that a block is used during simulation of the embedded application code.

Step 340 transforms the technology-independent, high-level UDL representation of the block into a technology-specific gate-level representation. Typically, each vendor has a library of technology-dependent gate-level functions. Gates are combinations of transistors which form a circuit that performs a logic function. The synthesis tool breaks down the high-level HDL statements into more primitive functions, searching the library to find a match between the functions required and those in the library. When a match is found, the synthesis tool instantiates the circuit into the design and gives it a cell instance name. The process is continued until the entire block has been mapped into logic circuits.

Once the block has been transformed to a gate-level representation, step 350 examines whether the block is non-removable. If so, then step 350 propagates must-keep tags to the gates, which have been instantiated to duplicate the functioning of the block. The propagation consists of marking the appropriate gates with "do not remove" tags, which indicate to the synthesis tool not to alter the gate logic. In this manner, the methods of the present invention prevent gates from being deleted when they have been instantiated to duplicate the functioning of a non-removable block.

After all blocks have been processed in steps 320 through 352, step 360 removes sinkless and sourceless logic from the gate-level core design. Sinkless logic is output from a gate which is not connected to any other gate. Sourceless logic is input to a gate which is not connected to any other gate. If a gate has sourceless pins, or if a gate feeds sinkless pins, then step 360 removes the gate unless the gate has a "do not remove" tag. The removal of sinkless and sourceless logic is a standard task performed by the synthesis tool. The synthesis tool recognizes "do not remove" tags, and does not alter the gate logic for tagged gates. In this way, the methods of the present invention prevent standard synthesis tools from altering the integrity of the core blocks, while allowing inefficient gate circuitry to be removed, if it can be removed without affecting the integrity of the core design. The gates that remain after step 360 are output to gate-level net model 142.

Referring back to FIG. 1, the next step, step 150, is to re-simulate the execution of the embedded application code. Re-simulation ensures that the low-level design produces the same results as the high-level design, that is that the core design has not been corrupted either by the synthesis process, or by removing blocks from the high-level design. Embedded application test suite 114 again provides the test input vectors and the complete range of applications which will be embedded upon the ASIC along with the core. During re-simulation, information is collected about which gates are used and unused by the applications. This information is written to zero toggle tags 152.

Figure 4:
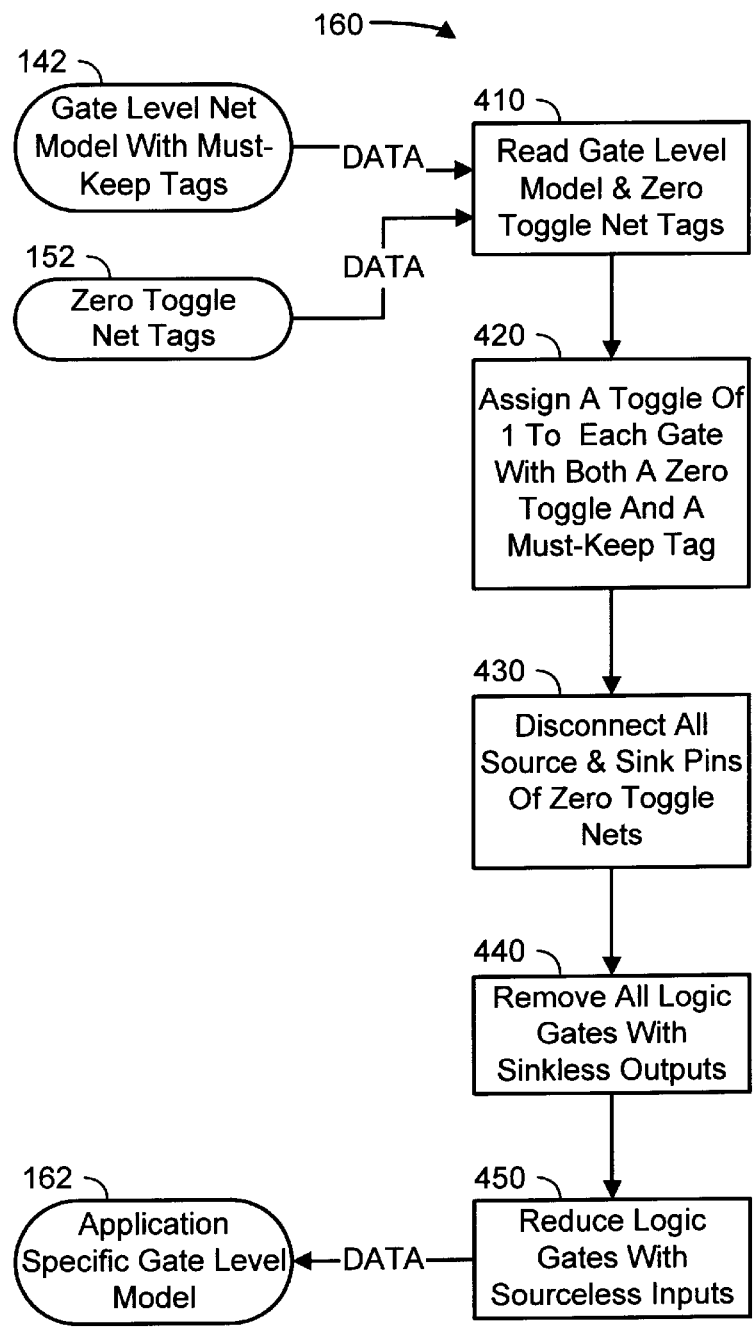
FIG. 4 is a flowchart of a gate-level synthesis process.

After gate level simulation, the next step, 160, is a low-level synthesis of gate level net model 142 to further tailor the core design. Referring now to FIG. 4, a flowchart of a preferred method to synthesize gate-level net model 142 is depicted. FIG. 4 further details steps taken during synthesis step 160 in method 100. In step 410, gate-level net model 142 is automatically read by the synthesis tool, and extension language is employed to read zero toggle gate tags file 152. Step 420 employs extension language to examine whether a gate has both a must-keep tag and a zero toggle. If so, step 420 reassigns the zero toggle to a non-zero toggle, so that the gate will not be deleted in subsequent steps.

The must-keep tags were propagated to the gates during high-level synthesis, for gates that were substituted for portions of non-removable blocks. The zero toggle information was collected during re-simulation of the embedded application code. If a gate has both a must-keep tag and a zero toggle, step 420 assigns a toggle equal to 1 to all output nets for that gate. In this manner, the methods of the present invention prevent gate logic from being altered in the subsequent synthesis processing, when that gate logic is tagged non-removable.

Once zero toggles have been changed to non-zero toggles for non-removable gates, step 430 employs extension language to disconnect all source and sink pins of zero toggle nets. After step 420, the only gates with zero toggle nets are gates that were substituted for removable blocks. By disconnecting the gate's input (source pins) and output (sink pins) from their interconnections in the design, step 430 identifies to the subsequent synthesis processing steps 440 and 450 in method 160 that this gate can be deleted. Step 440 removes all logic gates which have unconnected outputs (sinkless pins). Step 450 reduces all logic gates which have unconnected inputs (sourceless pins). In this manner all gates which are both removable and unused in the core design are deleted or at least reduced. The gates that remain after this logic reduction represent the tailored low-level core design, also called application specific gate level model 162.

Figure 5:
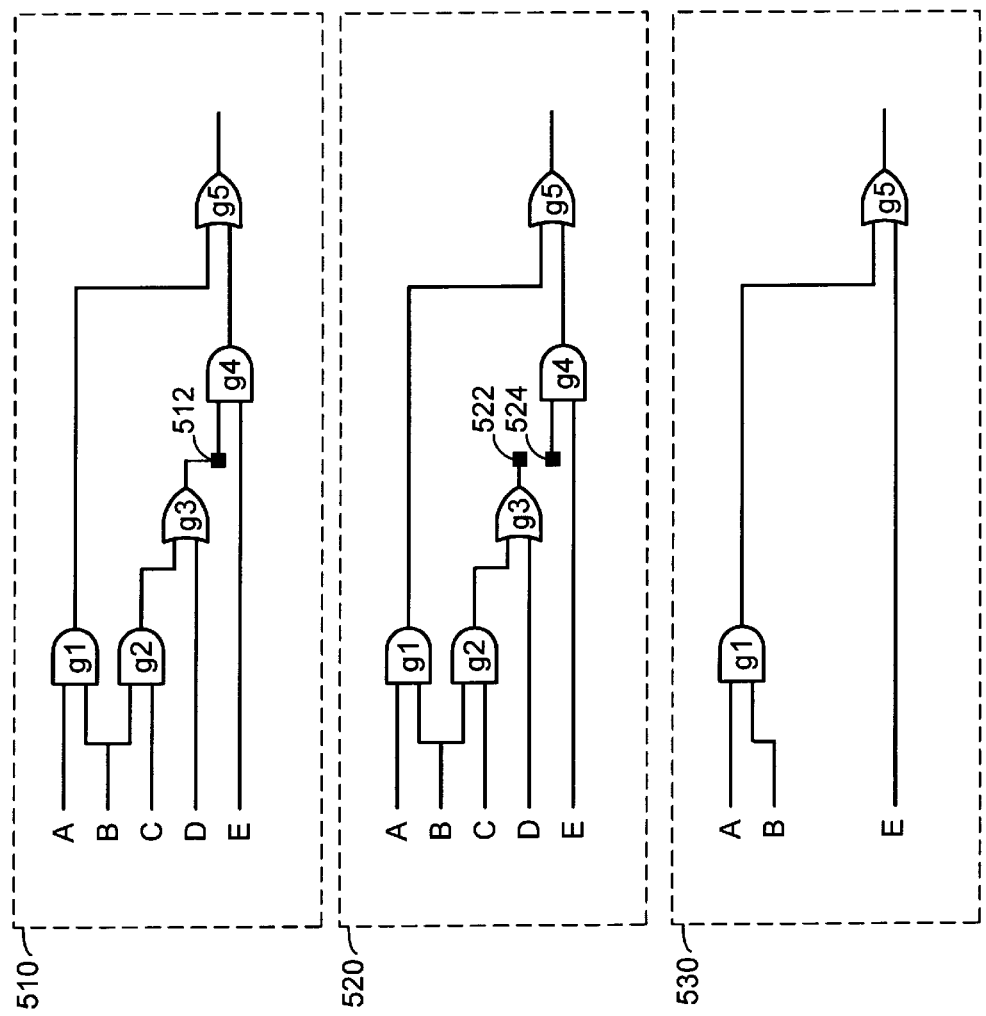
FIG. 5 is an illustration of how gate models are changed during gate-level synthesis.

Referring now to FIG. 5, an example of disconnecting a gate's source and sink pins to reduce gate logic is depicted. Diagram 510 illustrates a group of gates that contain zero toggle net 512, located during the re-simulation of the embedded application code. Extension language employed in step 430 of method 160 disconnects zero net toggle 512 from gates g3 and g4 to create an intermediate stage, depicted by diagram 520. Diagram 520 shows gates g2 and g3 feeding sinkless pin 522. Diagram 520 also shows that gate g4 has a sourceless pin. In this manner, the methods of the present invention identify to subsequent synthesis processing what gates can be removed from the gate-level design.

Step 440 of method 160 removes all gates that have sinkless pins, that is, all gates with unconnected outputs. From diagram 520, step 440 removes gates g2 and g3, because g3 has sinkless pin 522. Step 450 of method 160 reduces all gates that have sourceless pins, that is, all gates with unconnected inputs. Reducing a gate with a sourceless pin means simplifying the circuitry. For example, an AND gate with 3 inputs (one input of which is sourceless) can be reduced to become an AND gate with 2 inputs. As another example, a NOR gate with 2 inputs (one of which is sourceless) can be reduced to become an inverter. Optimally, a gate with a sourceless pin can be removed and replaced by a simple wire. From diagram 520, step 450 detects sourceless pin 524, and determines that gate g4 can be replaced with a simple wire. After the reduction, input port E is connected directly to gate g5.

Diagram 530 shows the results, after removing sinkless pins and reducing sourceless pins. Gates g2, g3, and g4 have been removed from the gate-level design. As a result, the load on port B has been cut in half which will speed up the circuit driving it and save power due to the lowered capacitive load on port B. Notice that although gate g2 might have toggled, since all it fed was zero toggle gate g3, it is not needed and thus removed. In this manner, the methods of the present invention save power consumed in switching gate g2, which had no effect on operation.

Referring back to FIG. 1, once specific gate-level model 162 is created by synthesis step 160, step 170 performs re-simulation just like step 150, again using embedded application test suite 114 as input. Re-simulation ensures that the low-level design after logic reduction in step 160 produces the same results as the low-level design before step 160. That is, step 170 is a gate-level verification of application specific gate-level model 162. Step 170 completes method 100. Having started with a general core design, the methods of the present invention determined what core logic to delete and deleted that logic, creating a core design tailored to the application code to be embedded with it on the ASIC. By eliminating unused blocks and gates, the tailored core gains the advantages of lower power consumption, reduced silicon area, and faster execution times.

In more detail, the process to customize a general purpose core design for use with embedded application code on a system on a chip can be summarized as follows. The blocks in a high-level HDL representation of the core design must be identified as either removable or non-removable. The high-level core design is run through behavioral simulation using an embedded application test suite that is comprised of the full set of application programs which will employ the core. Information about what blocks do not toggle during behavioral simulation is accumulated. Blocks which are both removable and unused during behavioral simulation are deleted from the high-level design.

The tailored high-level design is then synthesized into a low-level design, propagating removable and non-removable information down to the gate-level. The low-level core design is re-simulated using the embedded application test suite. Information about what gates do not toggle during re-simulation is accumulated. Gates which are both removable and unused during re-simulation are deleted from the low-level design. Finally, the resulting application specific low-level design is run through a gate-level verification process, once again using the embedded application test suite. Thus, the methods of the present invention provide an automated means to customize general purpose core designs for use with embedded application code on system in a chip designs.

While the invention has been particularly shown and described with reference to preferred methods thereof, it will be understood by those skilled in the art that various changes in form and details may be made therein without departing from the spirit and scope of the invention. For example, while various of the conductors (connections) are shown in the drawing as single lines, they are not so shown in a limiting sense, and may comprise plural conductor (connections), as is understood in the art.

What is claimed is:

1. A method for designing an application specific integrated circuit (ASIC), the method comprising the steps of:
  a) running an application to be performed by the ASIC on a simulation model of the ASIC, the model including removable and non-removable functions performable by the ASIC;
  b) monitoring operation of the model during said step of running said application, the step of monitoring including identifying the functions performable by the ASIC that are unused by the application; and
  c) removing from the simulation model unused functions that are also removable functions.

2. The method of claim 1 wherein said step of running an application comprises running each application that will foreseeably be performed by said ASIC, and wherein said step of monitoring comprises identifying said removable functions that are unused by any of said each application.

3. The method of claim 1 wherein said step of monitoring comprises creating zero toggle tags for functions which are both removable and unused by any of said application.

4. The method of claim 3 wherein said step of removing from the simulation model unused functions comprises synthesizing to a gate-level simulation model of the ASIC only functions which do not have zero toggle tags, the gate-level simulation model including removable and non-removable gates.

5. The method of claim 4 further comprising the steps of:
  d) re-running said application to be performed by the ASIC on said gate-level simulation model of the ASIC;
  e) monitoring operation of said gate-level simulation model during the step of re-running the application, the step of monitoring (e) including identifying gates in said gate-level simulation model that are unused by the application; and
  f) removing from the gate-level simulation model unused gates that are also removable gates.

6. The method of claim 5 further comprising the step of:
  g) verifying that the step of removing from the gate-level simulation model unused gates, did not alter or corrupt the functioning of said gate-level simulation model of the ASIC.

7. A method for designing an application specific integrated circuit (ASIC), the method comprising the steps of:
  a) representing a high-level ASIC design, wherein the high-level ASIC design is subdivided into a plurality of removable and non-removable blocks;
  b) behaviorally simulating on said high-level ASIC design execution of at least one application which will run on the ASIC;

c) monitoring operation of said high-level ASIC design during said behavioral simulation, said monitoring identifying which of said plurality of blocks are inactive during the behavioral simulation;

d) removing said inactive blocks from said high-level ASIC design if said inactive blocks are also removable blocks;

e) synthesizing said high-level ASIC design into a gate-level ASIC design, wherein said gate-level ASIC design is subdivided into a plurality of removable and non-removable gates;

f) re-simulating on said gate-level ASIC design execution of said at least one application that will run on said ASIC design;

g) monitoring operation of said gate-level ASIC design during said step of re-simulating, said monitoring (g) identifying which of said plurality of removable and non-removable gates are inactive during the re-simulation; and h) removing said inactive gates from said gate-level ASIC design, if said inactive gates are also removable gates.

8. The method of claim 7 further comprising the step of:
i) verifying that the step of removing said inactive gates from said gate-level ASIC design, did not alter or corrupt the functioning of said gate-level ASIC design.

9. The method of claim 7 wherein the step of behaviorally simulating the execution of at least one application comprises behaviorally simulating each application that will foreseeably run on said ASIC.

10. The method of claim 7 wherein the step of removing said inactive gates from said gate-level ASIC design comprises the steps of:
i) disconnecting source and sink pins of said inactive gates, if said inactive gates are also removable gates;
ii) removing at least one gate with a sinkless output; and
iii) reducing at least one gate with a sourceless input.

11. The method of claim 7 wherein the step of representing said high-level ASIC design comprises the step of identifying at least one non-removable block in a high-level ASIC design that is subdivided into a plurality of blocks.

12. The method of claim 11 wherein the step of synthesizing said high-level ASIC design into said gate-level ASIC design includes propagating information about non-removable blocks to each of at least one gate synthesized from each non-removable block.

13. The method of claim 11 wherein the step of identifying at least one non-removable block in said high-level ASIC design comprises inserting must-keep tags on non-removable blocks in said high-level ASIC design.

14. The method of claim 13 wherein the step of synthesizing said high-level ASIC design into said gate-level ASIC design includes propagating said must-keep tags to each of at least one gate synthesized from each non-removable block.

15. The method of claim 7 wherein the step of monitoring operation of said high-level ASIC design during said behavioral simulation further comprises the step of:
i) creating a zero toggle tag for each removable block in said high-level ASIC design that is inactive during behavioral simulation.

16. The method of claim 15 wherein the step of removing said inactive blocks from said high-level ASIC design if said inactive blocks are also removable blocks comprises deleting from said high-level ASIC design each block that has an associated zero toggle tag.

17. A method for designing an application specific integrated circuit (ASIC) comprising the steps of:
a) creating an application test suite comprised of each application that will foreseeably run on said ASIC, and a plurality of input test vectors to test out said each application;

b) selecting a general purpose core design required to support the execution of at least one of said each application that will foreseeably run on said ASIC, wherein said general purpose core design comprises a plurality of high-level hardware description language statements, and wherein said general purpose core design is subdivided into a plurality of blocks;

c) identifying at least one block in said general purpose core design which can be removed from said general purpose core design;

d) simulating execution of said application test suite using said general purpose core design, wherein the step of simulating (d) identifies at least one block within said general purpose core design that is unused during said execution of said application test suite;

e) creating a high-level tailored core design by removing said at least one unused block from said general purpose core design, when said at least one unused block is also a block that can be removed from said general purpose core design;

f) synthesizing said high-level tailored core design into a gate-level core design, wherein said gate-level core design comprises a netlist of circuit instances, and wherein said gate-level core design is subdivided into a plurality of gates;

g) propagating said identification of blocks which can be removed to at least one gate synthesized from each said block which can be removed;

h) simulating execution of said application test suite using said gate-level core design, wherein the step of simulating (h) identifies at least one gate within said gate-level core design that is unused during said execution of said application test suite; and i) creating a tailored gate-level core design by removing said at least one unused gate from said gate-level core design, when said at least one unused gate is also a gate that can be removed from said gate-level core design.

18. The method of claim 17 further comprising the step of:
j) verifying that said step of creating a tailored gate-level core design by removing at least one gate did not alter or corrupt the functioning of said gate-level core design.

19. The method of claim 17 wherein the step of creating a tailored gate-level core design by removing said at least one unused gate comprises the steps of:
i) disconnecting source and sink pins of gates which are both unused and can be removed;
ii) removing at least one gate from said gate-level core design, said at least one gate having a sinkless output; and
iii) reducing at least one gate from said gate-level core design, said at least one gate having a sourceless input.

* * * * *

UNITED STATES PATENT AND TRADEMARK OFFICE
CERTIFICATE OF CORRECTION

PATENT NO. : 6,237,132 B1
DATED : May 22, 2001
INVENTOR(S) : Dean et al.

Page 1 of 1

It is certified that error appears in the above-identified patent and that said Letters Patent is hereby corrected as shown below:

ABSTRACT,
Line 5, "...representation of the core des i on." should read as follows -- ...representation of the core design. --
Line 8, "...of the core design an are ta b y ed with..." should read as follows -- ...of the core design are tagged with... --
Line 13, "...which are unused, information about which...." should read as follows -- ...which are unused. Information about which... --
Line 24, "...tailored by deleting Yates..." should read as follows -- ...tailored by deleting gates... --

Column 9,
Line 37, "...level UDL representation..." should read as follows -- ...level HDL representation... --

Signed and Sealed this

Eleventh Day of December, 2001

Attest:

*Nicholas P. Godici*

NICHOLAS P. GODICI
*Attesting Officer*   *Acting Director of the United States Patent and Trademark Office*